(12) United States Patent
Early

(10) Patent No.: US 6,850,116 B1
(45) Date of Patent: Feb. 1, 2005

(54) ACCURATE, HIGH DRIVE, ZERO OFFSET VOLTAGE BUFFER

(75) Inventor: Adrian B. Early, Snohomish, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 10/306,339

(22) Filed: Nov. 27, 2002

Related U.S. Application Data

(60) Provisional application No. 60/334,139, filed on Nov. 28, 2001.

(51) Int. Cl.$^7$ .................................................. H03F 3/16
(52) U.S. Cl. ...................................... 330/277; 330/300
(58) Field of Search ................................. 330/277, 264, 330/300, 301, 116, 117

(56) References Cited

U.S. PATENT DOCUMENTS 5,023,567 A * 6/1991 O'Shaughnessy et al. .. 330/253
5,070,306 A * 12/1991 Okamoto ..................... 330/253
5,406,219 A * 4/1995 Lou ............................. 330/253
5,821,814 A * 10/1998 Katayama et al. .......... 330/277

* cited by examiner

Primary Examiner—Henry Choe
(74) Attorney, Agent, or Firm—Wagner, Murabito & Hao LLP

(57) ABSTRACT

A low offset voltage buffer which comprises a first, second, third and fourth MOS device, each comprising a gate, a source and a drain; a current source coupled to the drains of the first and second MOS devices; a current sink coupled to the sources of the third and fourth MOS devices; an input coupled to the gate of the third MOS device and an output coupled to the source of the first MOS device. The source of the first MOS device is coupled to the drain of the third MOS device and the source of the second MOS device is coupled to the drain of the fourth MOS device. The voltage buffer can also be implemented in both NMOS and PMOS devices.

14 Claims, 8 Drawing Sheets

100 NMOS HALF CIRCUIT IMPLEMENTATION

100 NMOS HALF CIRCUIT IMPLEMENTATION

200 PMOS HALF CIRCUIT IMPLEMENTATION

300 FULL CIRCUIT IMPLEMENTATION

400 N-CHANNEL CASCODE IMPLEMENTATION

450 P-CHANNEL CASCODE IMPLEMENTATION

500 NMOS CASCODE IMPLEMENTATION

600 PMOS CASCODE IMPLEMENTATION

700 FULL CIRCUIT CASCODE IMPLEMENTATION

ACCURATE, HIGH DRIVE, ZERO OFFSET VOLTAGE BUFFER

RELATED U.S. APPLICATION

This application claims priority to the co-pending provisional patent application Ser. No. 60/334,139, entitled "Accurate, High Drive, Zero Offset Voltage Buffer (Unity Gain Follower Circuit)" with filing date Nov. 28, 2001, assigned to the assignee of the present application and hereby incorporated by reference in its entirety. This application also incorporates herein by reference the co-pending patent application, Ser. No. 10/306,414, entitled "Process Providing High and Low Threshold N-Type and P-Type Transistors," filed concurrently herewith, and assigned to the assignee of the present application.

FIELD OF THE INVENTION

Embodiments of the present invention relate to the field of semiconductor devices, such as transistors. More specifically, embodiments of the present invention relate to circuit design in analog and hybrid signal processing chips.

BACKGROUND OF THE INVENTION

Modern electronic devices continue to shrink in size as they grow in capability. More and more tasks are being accomplished by fewer and fewer components.

The arena of analog and hybrid signal processing has special demands. Filters, voltage followers, and other analog and hybrid devices require analog functions that are not always easily accommodated in modern shrinking architecture. A limitation found in analog signal processing is the available die area and the power required for high speed operation. In even the best existing designs, filtering accuracy and gain come at the cost of decreasing speed and increasing complexity.

Prior fabrication techniques, too, have been unable to achieve some of the component combinations that help enable some analog and hybrid signal processing. The combination of n-channel and p-channel metal-oxide semiconductor (MOS) devices, especially transistors, has posed special challenges to fabrication.

One attribute associated with transistors is "threshold voltage," generally defined as the input voltage at which the output logic level of the transistor changes state. Another definition of the term "threshold voltage" is the gate voltage above which the transistor becomes conductive in an enhancement mode field-effect transistor (FET) or nonconductive in a depletion mode FET. The operational speed of a transistor is a function of its threshold voltage. To increase speed, the threshold voltage is decreased. However, there is a tradeoff; with decreased threshold voltage, the drive current and leakage current of the transistors can be increased. Depending on the application of the transistor, a designer must select a particular threshold voltage for the transistor based on many factors, including speed and power consumption.

Types of transistors known in the art include those commonly referred to as NMOS (negative-channel metal-oxide semiconductor) devices and PMOS (positive-channel metal-oxide semiconductor) devices. The threshold voltage of these types of devices is dependent on the original doping concentration of the silicon substrate used as the foundation for forming the transistor.

For PMOS devices, the threshold voltage can be reduced by adjusting the original doping concentration using another, subsequent implantation of dopant into the substrate. In the case in which boron ions (or ions that include boron, such as $BF_2$) are used as the dopant, this latter implantation is sometimes referred to as the "boron adjust." More generally, it may be referred to as the "threshold adjust." By adding dopant, particularly a p-type dopant that includes boron, the threshold voltage of a PMOS device is lowered.

As described above, NMOS devices having a particular threshold voltage can be fashioned by specifying the appropriate original doping concentration. However, according to the conventional art, a threshold adjust process for reducing the threshold voltage of such devices is lacking.

With the advent of techniques described in the above referenced application, low threshold NMOS and PMOS devices can be accommodated in a single chip. However, circuit design techniques required for hybrid and analog signal processing have not been developed to exploit low threshold NMOS and PMOS devices in the same chip.

SUMMARY OF THE INVENTION

Accordingly, embodiments of the present invention present a high-accuracy, high-drive, zero-offset, voltage buffer. Some embodiments can also be addressed as unity gain follower circuits. Embodiments have application in analog and hybrid signal processing devices and other applications requiring rapid slewing, at zero offset, following analog signals.

A low offset voltage buffer is presented which comprises a first, second, third and fourth MOS device, each comprising a gate, a source and a drain; a current source coupled to the drains of the first and second MOS devices; a current sink coupled to the sources of the third and fourth MOS devices; an input coupled to the gate of the third MOS device and an output coupled to the drain of the first MOS device. The source of the first MOS device is coupled to the drain of the third MOS device and the source of the second MOS device is coupled to the drain of the fourth MOS device. The voltage buffer can also be implemented in both NMOS and PMOS devices.

Embodiments of the present invention present a low offset follower that is a fast, low power, small area, buffer for use in amplifier output stages and advanced (buffer based) delta sigma modulators, such as used in ADCs; reconstruction filters, used in DACs and switched capacitor, or RC active, filters; and other analog and mixed signal functions. These embodiments of the present invention use an op-amp-free approach to unity gain filters. However, embodiments of the present invention have little or no systematic offset compared with state of the art source-follower buffers. In one embodiment, the low offset follower also gives improved slew rate and drive capability in both directions and low power operation capability compared with these buffers. The speed power product is thus improved compared with existing voltage followers or buffers. Furthermore, embodiments of the present invention employ manufacturing techniques presented in the above reference co-pending applications to efficiently fabricate these circuits in a single, high device density, chip.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation and components of this invention can be best visualized by reference to the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

This application incorporates herein by reference the co-pending provisional patent application Ser. No. 60/334, 139, entitled "Accurate, High Drive, Zero Offset Voltage Buffer (Unity Gain Follower Circuit)", with filing date Nov. 28, 2001, assigned to the assignee of the present application and hereby incorporated by reference in its entirety. This application also incorporates herein by reference the co-pending patent application, Ser. No. 10/306,414, entitled "Process Providing High and Low Threshold N-Type and P-Type Transistors," filed concurrently herewith, and assigned to the assignee of the present application.

Figure 1:
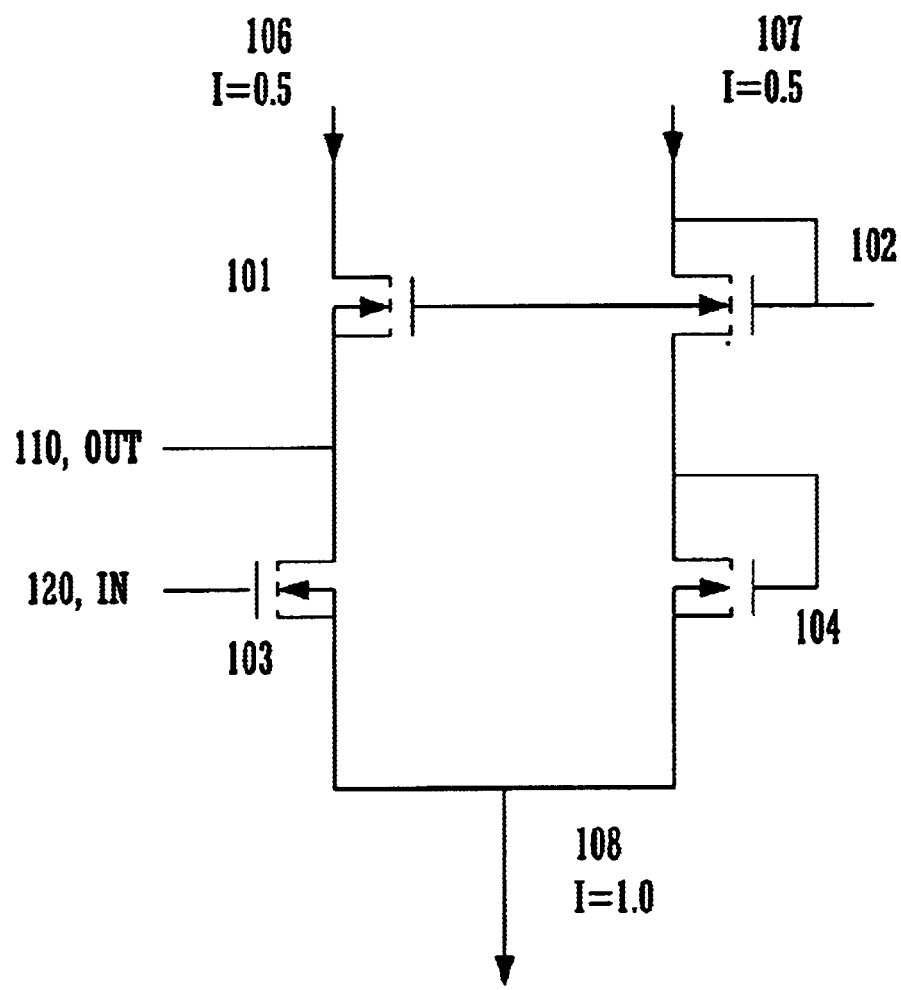
FIG. 1 illustrates an NMOS implemented half circuit in accordance with an embodiment of the present invention.

FIG. 1 illustrates a drain follower half circuit implemented in n-channel, metal-oxide semiconductor field-effect transistors (NMOSFETs), according to one embodiment of the present invention. It is noted that such a drain follower circuit can also be implemented in p-channel MOSFETs (PMOSFETs) as illustrated below in FIG. 2, etc.

The circuit illustrated in FIG. 1 comprises n-channel MOSFETs 101, 102, 103 and 104. The drains of MOSFETs 101 and 102 are supplied with a balanced current source. The gate of MOSFET 102 is connected to its drain and its substrate channel is connected to the gate of MOSFET 101.

The circuit input, 120, is connected to the gate of MOSFET 103 and the circuit output 110 is connected to the drain of MOSFET 103. Because the drain of MOSFET 103 and the source of MOSFET 101 are connected, the source of MOSFET 101 is also connected to the output 110. MOSFET 104 is on the source of MOSFET 102 and, like MOSFET 102, is gate/drain connected. The sources of MOSFETs 103 and 104 are connected together and to the current sink 108.

The half circuit illustrated in FIG. 1, implemented in n-channel MOSFETs, provides active pull-up through MOSFET 101. Active pull-down Is better provided in another embodiment of the present invention, the half circuit illustrated in FIG. 2, which is implemented in p-channel MOSFETS.

Figure 2:
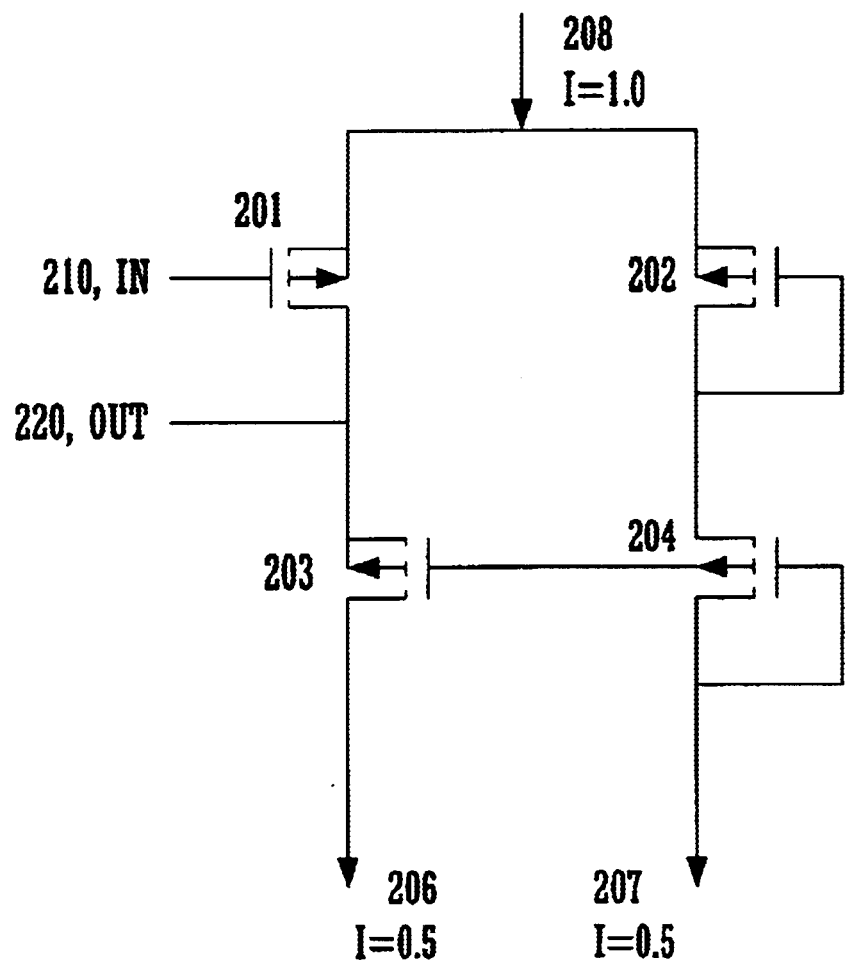
FIG. 2 illustrates a PMOS implemented half circuit in accordance with an embodiment of the present invention.

In FIG. 2, a common current source 208 feeds the sources of p-channel MOSFETs 201 and 202. The gate of MOSFET 201 is coupled to the circuit input, 220. The gate of MOSFET 202 is connected to its drain which is also connected to the source of MOSFET 204. The drain of MOSFET 201, which connects to the circuit output 210, is also connected to the source of MOSFET 203. The gate of MOSFET 203 is connected to the substrate bulk of MOSFET 208, whose gate is connected to its drain. The drains of each MOSFET, 203 and 204, connect to balanced current sinks 206 and 207.

Figure 3:
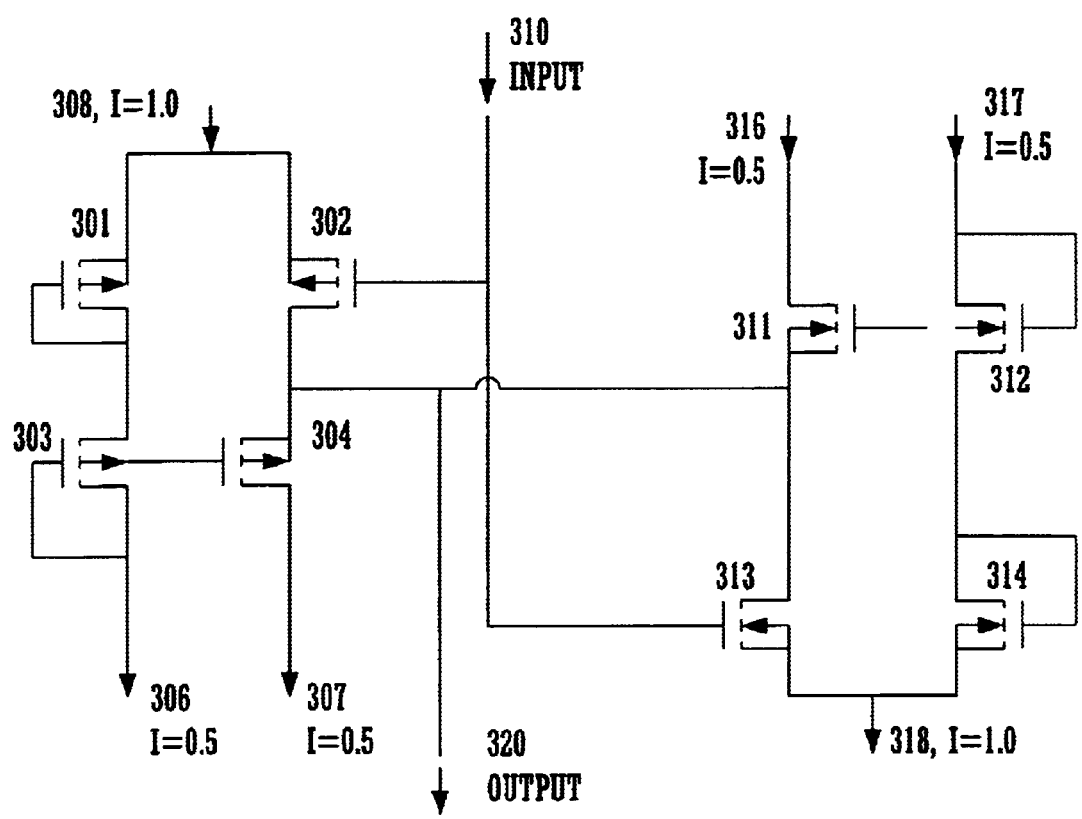
FIG. 3 illustrates a full circuit, implementing both NMOS and PMOS devices in accordance with an embodiment of the present invention.

FIG. 3 illustrates an embodiment of the present invention which uses PMOS and NMOS implementations to achieve good drive as well as fast slewing capability in both directions. The inputs of both half circuits are tied together, 310, as are the outputs of both half circuits at 320. The PMOS half circuit, comprising PMOSFETs 301, 302, 303 and 304, provides active pull-down through PMOSFET 303. The NMOS half circuit, comprising NMOSFETs 311, 312, 323 and 314, provides active pull-up through NMOSFET 311.

FIG. 3 illustrates the "full" circuit implementation 300, meaning a circuit employing both NMOS and PMOS half circuits, wherein the well, or substrate, ties are to the sources of the MOSFETs. In other embodiments, the source ties can be to a common substrate. The offset voltages of the MOSFET devices match, so the body effect is not a first order source of error with the embodiments of the present invention described here.

Figure 4A:
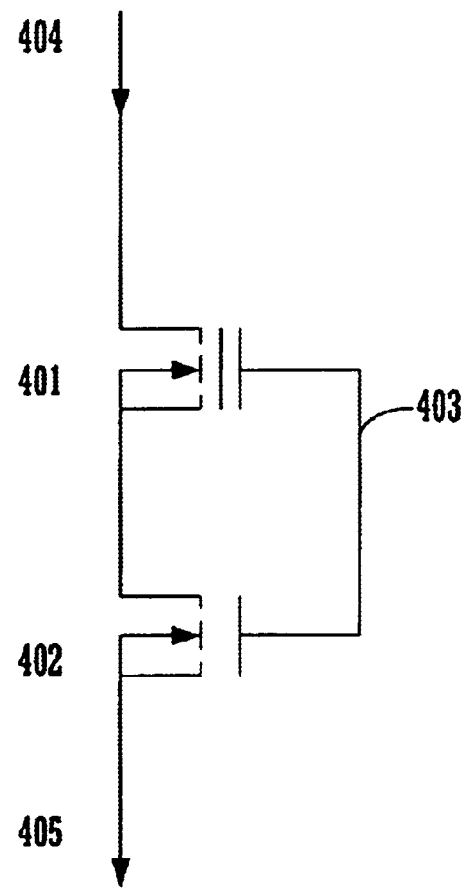
FIG. 4A illustrates a cascoded NMOS device in accordance with an embodiment of the present invention.
Figure 4B:
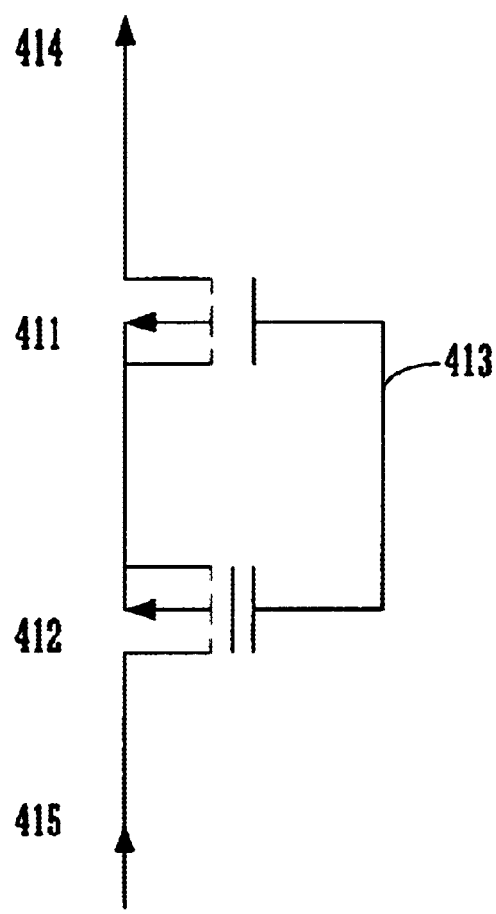
FIG. 4B illustrates a cascoded NMOS device in accordance with an embodiment of the present invention.

FIGS. 4A, 4B, 5 and 6 illustrate an implementation of this embodiment of the present invention that provides improved gain accuracy and power supply rejection, according to various embodiments of the present invention. In this high accuracy variation of the present invention, the MOSFETs are implemented in cascode. A cascoded implementation of an NMOS device as illustrated in FIG. 4A or a PMOS device as shown in FIG. 4B, improves the gain accuracy or the overall follower, and improves power supply rejection.

FIG. 4A illustrates one implementation, 400, of a cascoded NMOS device. NMOSFET 402 is gate connected, 403, to NMOSFET 401. NMOSFET 401 is a low threshold device. Current is supplied, 404, to the drain of low threshold NMOSFET 401. Current output, 405, is via the source of NMOSFET 402.

Similarly, FIG. 4B illustrates an implementation, 450, of cascoded PMOS device. PMOSFET 411 is gate connected, 413, to PMOSFET 412. PMOSFET 412 is a low threshold device. Current is supplied, 415, to the drain of low threshold PMOSFET 412. Current output, 414, is via the source of PMOSFET 411.

Figure 5:
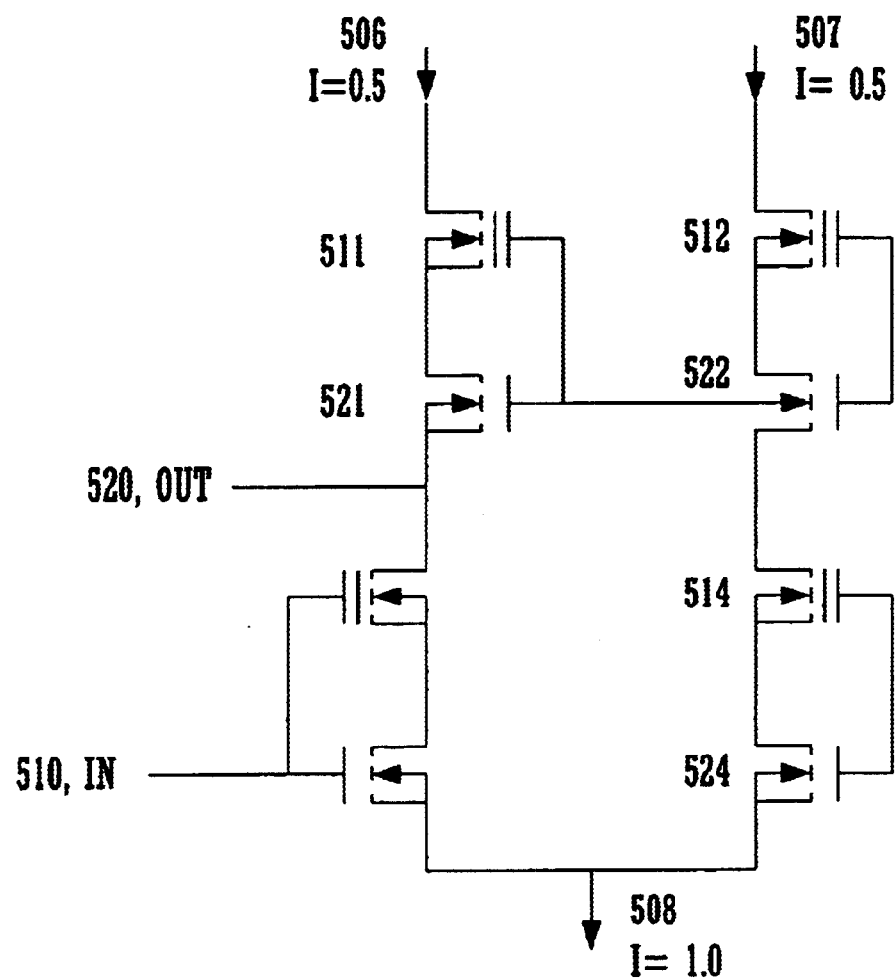
FIG. 5 illustrates a cascoded half circuit comprising NMOS devices in accordance with an embodiment of the present invention.

In FIG. 5, a cascoded implementation of an NMOS half circuit, 500, is illustrated. Cascoded half circuit 500 is shown with cascoded NMOSFETs in place of NMOS devices as shown in NMOS half circuit implementation 100.

As shown, each of the four NMOS devices of half circuit 100 is replaced with cascoded device pair to produce cascoded half circuit 500. NMOSFET devices 511 and 521 replace NMOSFET 101, NMOSFET devices 512 and 522 replace NMOSFET 102, NMOSFET devices 513 and 523 replace NMOSFET 103, and NMOSFET devices 514 and 524 replace NMOSFET 104. While embodiments of the present invention may cascode any of the basic four NMOSFETs, the implementation illustrated in FIG. 5, in which all NMOSFET devices are replaced, provides an accurate unity gain drain follower with active pull-up. Current is supplied to cascoded half circuit 500 via balanced current supplies at 506 and 507. Current is sunk in sink 508. Device input is at 510 and device output is at 520.

Figure 6:
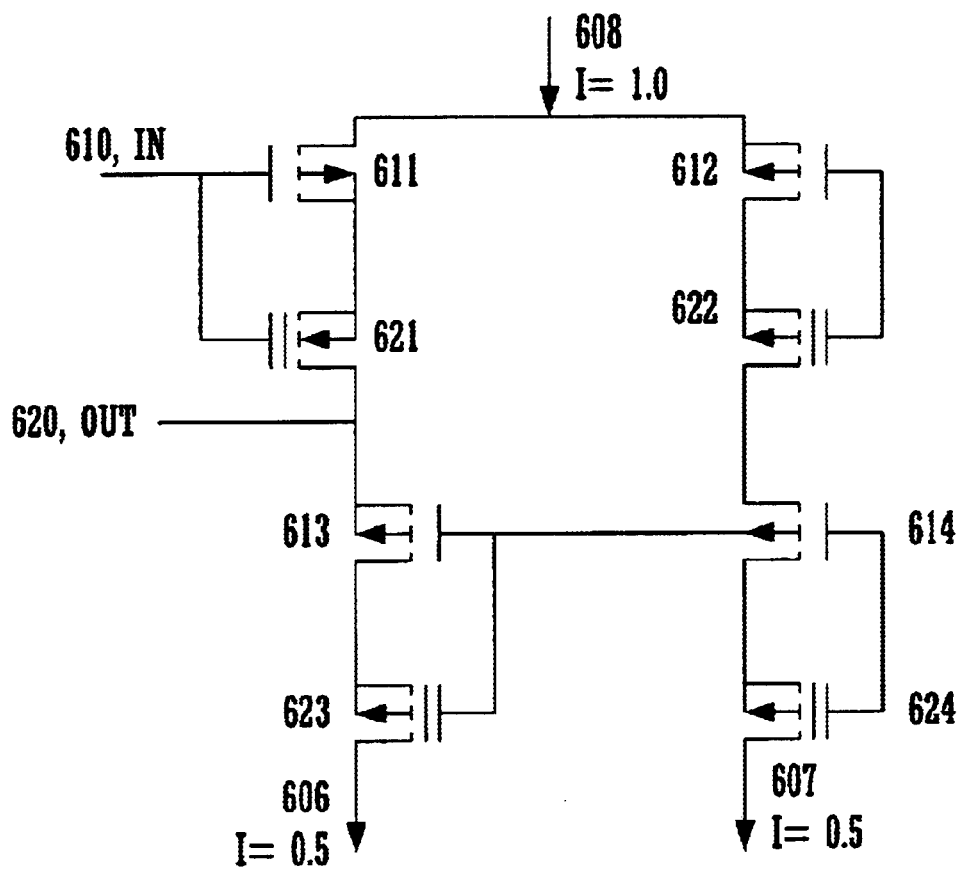
FIG. 6 illustrates a cascoded half circuit comprising PMOS devices in accordance with an embodiment of the present invention.

Similar to the cascoded device replacement of FIG. 5, FIG. 6 illustrates a cascoded implementation of a PMOS half circuit, 600. Cascoded half circuit 600 is shown with cascoded PMOSFETs in place of PMOS devices as shown in PMOS half circuit implementation 200. As shown, each of the four PMOS devices of half circuit 200 is replaced with cascoded device pair to produce cascoded half circuit 600. PMOSFET devices 611 and 621 replace PMOSFET 201, PMOSFET devices 612 and 622 replace PMOSFET 202, PMOSFET devices 613 and 623 replace PMOSFET 203, and PMOSFET devices 614 and 624 replace PMOSFET 204. While embodiments of the present invention may cascode any of the basic four PMOSFETs, the implementation illustrated in FIG. 6, in which all PMOSFET devices are replaced, provides an accurate unity gain drain follower with active pull-down. Current is supplied to cascoded half circuit 600 via current source 608. Current is sunk in balanced current sinks 606 and 607. Device input is at 610 and device output is at 620.

Figure 7:
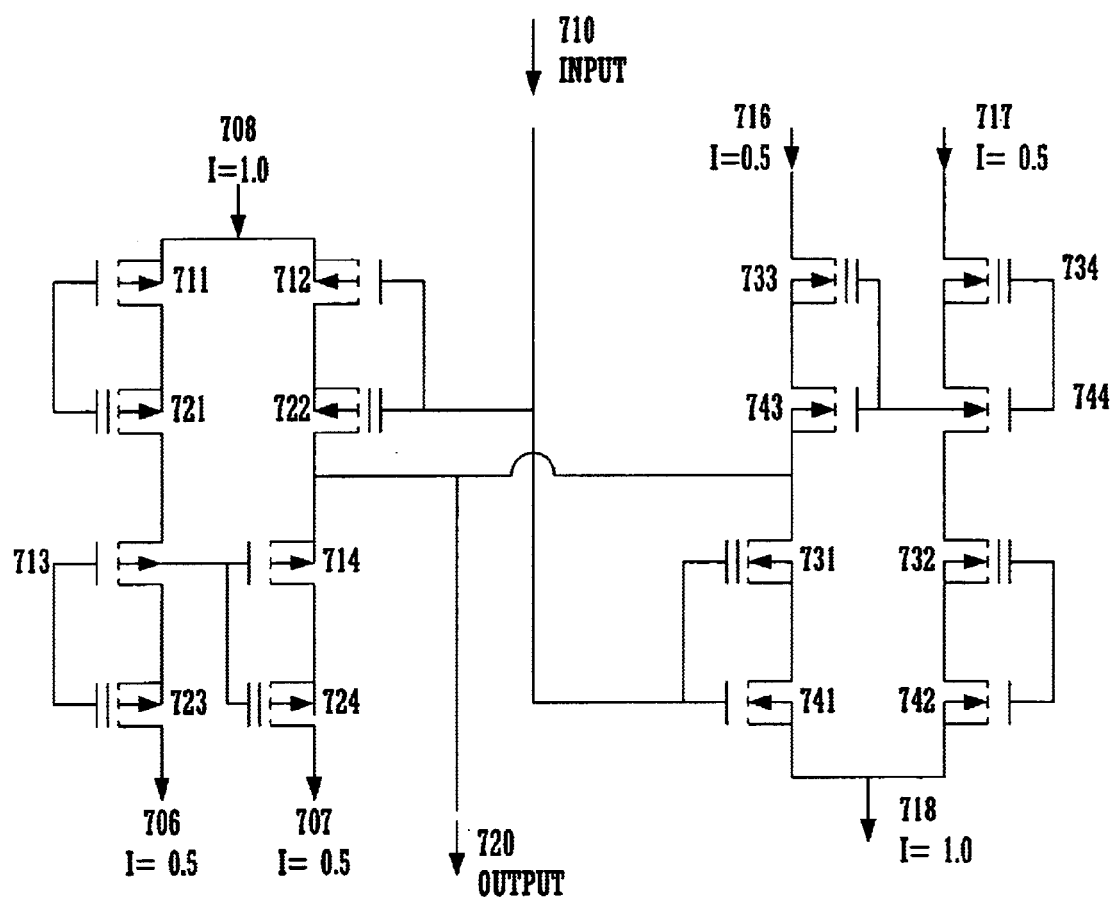
FIG. 7 illustrates a cascoded full circuit comprising both NMOS and PMOS devices in accordance with an embodiment of the present invention.

The cascading detailed above makes each of the circuits allows each circuit to act as a cascoded drain follower. In FIG. 7, the illustration of a full circuit cascoded implementation, all transistors are cascoded by composite N channel or composite P channel devices as shown in FIGS. 4A and 4B. Full cascoded follower circuit 700 comprises both cascoded NMOS half circuit 500 and cascoded PMOS half circuit 600. The two half circuits are, similar to what is implemented in circuit 300, connected together at input 710 and at output 720. Current is supplied at supplies 708, 716 and 717. Current is sunk at current sinks 706, 707 and 718.

The cascoded implementation of both NMOS and PMOS half circuits provides a very accurate unity gain follower circuit, or buffer. With both NMOS and PMOS devices implemented, rapid, active pull-up and pull-down enable very accurate following. The embodiments of the present invention described here present a low offset follower that is a fast, low power, small area, buffer for use in amplifier output stages and advanced (buffer based) delta sigma modulators, such as used in ADCs; reconstruction filters, used in DACs and switched capacitor, or RC active, filters; and other analog and mixed signal functions. These embodiments of the present invention use an op-amp-free approach to unity gain filters. However, embodiments of the present invention have little or no systematic offset compared with state of the art source-follower buffers. In one embodiment, the low offset follower also gives improved slew rate and drive capability in both directions and low power operation capability compared with these buffers. The speed power product is thus improved compared with existing voltage followers or buffers. Furthermore, embodiments of the present invention employ manufacturing techniques presented in the above reference co-pending applications to efficiently fabricate these circuits in a single, high device density, chip.

Modern chip manufacturing techniques enable implementation of both PMOS and NMOS devices in proximity. By employing both p-channel and n-channel devices in the voltage follower, the advantages of both are put to good use to produce accuracy and speed that are unattainable in conventional analog or hybrid chip implementations.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A voltage buffer, comprising:
    a first, second, third and fourth MOS device, each comprising a gate, a source and a drain;
    a balanced current source coupled to said drains of said first and second MOS devices, said balanced current source supplying substantially a same amount of current to said first and second MOS devices;
    a current sink coupled to said sources of said third and fourth MOS devices;
    an input coupled to said gate of said third MOS device; and
    an output coupled to said source of said first MOS device, wherein said source of said first MOS device is coupled to said drain of said third MOS device and said source of said second MOS device is coupled to said drain of said fourth MOS device.

2. The voltage buffer recited in claim 1 wherein said first, second, third and fourth MOS devices are NMOS devices.

3. The voltage buffer recited in claim 1 wherein the substrate of said second MOS device is coupled to said gate of said first MOS device.

4. The voltage buffer recited in claim 1 wherein said MOS devices are cascoded MOS devices.

5. The voltage buffer recited in claim 1 wherein said MOS devices are low threshold devices.

6. The voltage buffer recited in claim 1 wherein said gate and drain of said second MOS device are coupled together.

7. The voltage buffer recited in claim 1 wherein said gate and drain of said fourth MOS device are coupled together.

8. The voltage buffer recited in claim 1 wherein said sources of said third and fourth MOS devices are coupled to a common current sink.

9. The voltage buffer recited in claim 1 further comprising:
    a fifth, sixth, seventh and eighth MOS device, each comprising a gate, a source and a drain;
    a current source coupled to said drains of said fifth and sixth MOS devices;
    a current sink coupled to said source of said seventh MOS device;
    a current sink coupled to said source of said eighth MOS device;
    an input coupled to said gate of said fifth and sixth MOS devices; and
    an output coupled to said drain of said fifth MOS device, wherein said drain of said fifth MOS device is coupled to said source of said seventh MOS device and said drain of said sixth MOS device is coupled to said source of said eighth MOS device, wherein said first, second, third and fourth MOS devices comprise a first half circuit and wherein said fifth, sixth, seventh and eighth MOS devices comprise a second half circuit and wherein the inputs of said half circuits are electronically coupled together.

10. The voltage buffer recited in claim 9 wherein said fifth, sixth, seventh and eighth MOS devices are PMOS devices.

11. The voltage buffer recited in claim 9 wherein said current sink coupled to said source of said seventh MOS device and said current sink coupled to said source of said eighth MOS device are balanced current sinks.

12. The voltage buffer recited in claim 9 wherein said fifth, sixth, seventh and eighth MOS devices are each implemented as pairs of cascoded PMOS devices.

13. The voltage buffer recited in claim 9 wherein said output coupled to said drain of said fifth MOS device provides pull-down capability.

14. The voltage buffer recited in claim 9 wherein said output coupled to said source of said first MOS device provides pull-up capability.

* * * * *